United States Patent
Gat

[11] Patent Number: 5,970,214
[45] Date of Patent: Oct. 19, 1999

[54] HEATING DEVICE FOR SEMICONDUCTOR WAFERS

[75] Inventor: Arnon Gat, Palo Alto, Calif.

[73] Assignee: AG Associates, San Jose, Calif.

[21] Appl. No.: 09/078,856

[22] Filed: May 14, 1998

[51] Int. Cl.⁶ .......................... C23C 16/00; H05B 35/00; F27B 5/14; F27D 11/02
[52] U.S. Cl. .......................... 392/416; 392/411; 219/405; 219/411; 219/494; 118/725; 250/492.22; 250/495.1
[58] Field of Search ...................................... 219/390, 405, 219/411, 494; 392/411, 416, 422, 423, 424; 118/50.1, 724, 725, 730; 250/492.22, 495.1; 438/799

[56] References Cited

U.S. PATENT DOCUMENTS

| | | |
|---|---|---|
| 2,057,776 | 10/1936 | Groven . |
| 2,318,533 | 5/1943 | Selvig . |
| 3,623,712 | 11/1971 | McNeilly et al. . |
| 3,761,678 | 9/1973 | Eckles . |
| 3,796,182 | 3/1974 | Rosler . |
| 3,830,194 | 8/1974 | Benzing et al. . |
| 3,836,751 | 9/1974 | Anderson . |
| 3,862,397 | 1/1975 | Anderson et al. . |
| 3,936,686 | 2/1976 | Moore . |
| 4,001,047 | 1/1977 | Boah . |
| 4,041,278 | 8/1977 | Boah . |
| 4,047,496 | 9/1977 | McNeilly et al. . |
| 4,048,955 | 9/1977 | Anderson . |
| 4,081,313 | 3/1978 | McNeilly et al. . |
| 4,097,226 | 6/1978 | Erikson et al. . |
| 4,101,759 | 7/1978 | Anthony et al. . |
| 4,115,163 | 9/1978 | Gorina et al. . |
| 4,184,065 | 1/1980 | Nagashima . |
| 4,221,956 | 9/1980 | Fielding et al. . |
| 4,224,504 | 9/1980 | Erikson et al. . |
| 4,232,360 | 11/1980 | Vakil et al. . |
| 4,270,260 | 6/1981 | Krueger . |
| 4,378,956 | 4/1983 | Lester . |
| 4,389,970 | 6/1983 | Edgerton . |

(List continued on next page.)

FOREIGN PATENT DOCUMENTS

| | | |
|---|---|---|
| 0308388A1 | 3/1989 | European Pat. Off. . |
| 0468874A2 | 1/1992 | European Pat. Off. . |
| 58-24788 | 2/1983 | Japan . |
| 59-17253 | 1/1984 | Japan . |
| 60-727 | 1/1985 | Japan . |
| 60-253939 | 12/1985 | Japan . |
| 60-258915 | 12/1985 | Japan . |
| 60-258928 | 12/1985 | Japan . |
| 61-196515 | 8/1986 | Japan . |
| 61-199631 | 9/1986 | Japan . |
| 62-20308 | 1/1987 | Japan . |
| 62-33418 | 2/1987 | Japan . |
| 62-46516 | 2/1987 | Japan . |
| 63-39930 | 3/1988 | Japan . |
| 63-143814 | 6/1988 | Japan . |
| 63-149524 | 10/1988 | Japan . |
| 63-260127 | 10/1988 | Japan . |
| 63-263719 | 10/1988 | Japan . |
| 63-269515 | 11/1988 | Japan . |
| 64-11324 | 1/1989 | Japan . |
| 64-90525 | 4/1989 | Japan . |
| 1-204114 | 8/1989 | Japan . |
| 1-239428 | 9/1989 | Japan . |
| 2180989 | 5/1989 | United Kingdom . |

Primary Examiner—Joseph Pelham
Attorney, Agent, or Firm—Dority & Mannings, P.A.

[57] ABSTRACT

An apparatus for heat treating semiconductor wafers is disclosed. The apparatus includes a heating device which contains an assembly of light energy sources for emitting light energy onto a wafer. In particular, the light energy sources are positioned such that many different radial heating zones are created on a wafer being heated. The light energy sources form concentric rings. Tuning light sources are then placed in between the concentric rings of light.

26 Claims, 3 Drawing Sheets

U.S. PATENT DOCUMENTS

| | | |
|---|---|---|
| 4,411,619 | 10/1983 | Darnell et al. . |
| 4,436,985 | 3/1984 | Weber . |
| 4,442,338 | 4/1984 | Yamazaki . |
| 4,446,817 | 5/1984 | Crawley . |
| 4,448,000 | 5/1984 | Manuccia et al. . |
| 4,470,369 | 9/1984 | Edgerton . |
| 4,477,718 | 10/1984 | Crain et al. . |
| 4,489,234 | 12/1984 | Harnden, Jr. et al. . |
| 4,496,828 | 1/1985 | Kusmierz et al. . |
| 4,504,323 | 3/1985 | Arai et al. . |
| 4,504,730 | 3/1985 | Shimizu . |
| 4,508,960 | 4/1985 | Arai . |
| 4,510,555 | 4/1985 | Mori . |
| 4,511,788 | 4/1985 | Arai et al. . |
| 4,517,448 | 5/1985 | Crain et al. . |
| 4,533,820 | 8/1985 | Shimizu . |
| 4,540,876 | 9/1985 | McGinty . |
| 4,543,472 | 9/1985 | Arai et al. . |
| 4,544,418 | 10/1985 | Gibbons . |
| 4,545,327 | 10/1985 | Campbell et al. . |
| 4,550,245 | 10/1985 | Arai et al. . |
| 4,550,684 | 11/1985 | Mahawili . |
| 4,551,616 | 11/1985 | Buttery . |
| 4,558,660 | 12/1985 | Nishizawa et al. . |
| 4,567,352 | 1/1986 | Mimura et al. . |
| 4,571,486 | 2/1986 | Arai et al. . |
| 4,581,520 | 4/1986 | Vu et al. . |
| 4,607,591 | 8/1986 | Stitz . |
| 4,615,294 | 10/1986 | Scapple et al. . |
| 4,632,056 | 12/1986 | Stitz et al. . |
| 4,632,057 | 12/1986 | Price et al. . |
| 4,640,224 | 2/1987 | Bunch et al. . |
| 4,642,243 | 2/1987 | Yamazaki . |
| 4,649,261 | 3/1987 | Sheets . |
| 4,653,428 | 3/1987 | Wilson et al. . |
| 4,654,509 | 3/1987 | Robinson et al. . |
| 4,680,447 | 7/1987 | Mahawili . |
| 4,680,451 | 7/1987 | Gat et al. . |
| 4,694,143 | 9/1987 | Nishimura et al. . |
| 4,698,486 | 10/1987 | Sheets . |
| 4,755,654 | 7/1988 | Crowley et al. . |
| 4,761,538 | 8/1988 | Chiba et al. . |
| 4,789,771 | 12/1988 | Robinson et al. . |
| 4,796,562 | 1/1989 | Brors et al. . |
| 4,806,321 | 2/1989 | Nishizawa et al. . |
| 4,817,558 | 4/1989 | Itoh . |
| 4,820,377 | 4/1989 | Davis et al. . |
| 4,820,906 | 4/1989 | Stultz . |
| 4,830,700 | 5/1989 | Davis et al. . |
| 4,832,777 | 5/1989 | Davis et al. . |
| 4,832,778 | 5/1989 | Davis et al. . |
| 4,832,779 | 5/1989 | Fisher et al. . |
| 4,836,138 | 6/1989 | Robinson et al. . |
| 4,854,263 | 8/1989 | Chang et al. . |
| 4,857,139 | 8/1989 | Tashiro et al. . |
| 4,857,704 | 8/1989 | Jannot et al. . |
| 4,859,832 | 8/1989 | Uehara et al. . |
| 4,886,954 | 12/1989 | Yu et al. . |
| 4,901,670 | 2/1990 | Ahlgren . |
| 4,908,495 | 3/1990 | Ishii et al. . |
| 4,911,103 | 3/1990 | Davis et al. . |
| 4,913,929 | 4/1990 | Moslehi et al. . |
| 4,914,276 | 4/1990 | Blair . |
| 4,919,077 | 4/1990 | Oda et al. . |
| 4,920,918 | 5/1990 | Adams et al. . |
| 4,924,073 | 5/1990 | Chiba . |
| 4,924,807 | 5/1990 | Nakayama et al. . |
| 4,956,538 | 9/1990 | Moslehi . |
| 4,958,061 | 9/1990 | Wakabayashi et al. . |
| 4,975,561 | 12/1990 | Robinson et al. . |
| 4,979,466 | 12/1990 | Nishitani et al. . |
| 4,981,815 | 1/1991 | Kakoschke . |
| 4,985,281 | 1/1991 | Ahlgren . |
| 4,989,544 | 2/1991 | Yoshikawa . |
| 5,000,113 | 3/1991 | Wang et al. . |
| 5,011,794 | 4/1991 | Grim et al. . |
| 5,033,407 | 7/1991 | Mizuno et al. . |
| 5,038,395 | 8/1991 | Lenski . |
| 5,044,943 | 9/1991 | Bowman et al. . |
| 5,047,611 | 9/1991 | Stultz . |
| 5,053,247 | 10/1991 | Moore . |
| 5,057,668 | 10/1991 | Gisdakis et al. . |
| 5,073,698 | 12/1991 | Stultz . |
| 5,085,887 | 2/1992 | Adams et al. . |
| 5,108,792 | 4/1992 | Anderson et al. . |
| 5,113,929 | 5/1992 | Nakagawa et al. . |
| 5,129,360 | 7/1992 | Ahern et al. . |
| 5,148,714 | 9/1992 | Mcdiarmid . |
| 5,154,512 | 10/1992 | Schietinger et al. . |
| 5,155,337 | 10/1992 | Sorrell et al. . |
| 5,156,820 | 10/1992 | Wong et al. . |
| 5,160,545 | 11/1992 | Maloney et al. . |
| 5,179,677 | 1/1993 | Anderson et al. . |
| 5,188,058 | 2/1993 | Nakai . |
| 5,194,401 | 3/1993 | Adams et al. . |
| 5,207,835 | 5/1993 | Moore . |
| 5,215,588 | 6/1993 | Rhieu . |
| 5,244,501 | 9/1993 | Nakayama et al. . |
| 5,252,132 | 10/1993 | Oda et al. . |
| 5,252,366 | 10/1993 | Ahern et al. . |
| 5,259,881 | 11/1993 | Edwards et al. . |
| 5,268,989 | 12/1993 | Moslehi et al. . |
| 5,269,847 | 12/1993 | Anderson et al. . |
| 5,271,084 | 12/1993 | Vandenabeele et al. . |
| 5,275,629 | 1/1994 | Ajika et al. . |
| 5,288,364 | 2/1994 | Burt et al. . |
| 5,305,417 | 4/1994 | Najm et al. . |
| 5,308,161 | 5/1994 | Stein . |
| 5,314,538 | 5/1994 | Maeda et al. . |
| 5,315,092 | 5/1994 | Takahashi et al. . |
| 5,317,492 | 5/1994 | Gronet et al. . |
| 5,322,567 | 6/1994 | Deaton et al. . |
| 5,332,442 | 7/1994 | Kubodera et al. . |
| 5,332,883 | 7/1994 | Higashira . |
| 5,345,534 | 9/1994 | Najm et al. . |
| 5,348,587 | 9/1994 | Eichman et al. . |
| 5,364,667 | 11/1994 | Rhieu . |
| 5,366,554 | 11/1994 | Kanai et al. . |
| 5,367,606 | 11/1994 | Moslehi et al. . |
| 5,372,648 | 12/1994 | Yamomoto et al. . |
| 5,380,682 | 1/1995 | Edwards et al. . |
| 5,414,244 | 5/1995 | Imahashi . |
| 5,418,885 | 5/1995 | Hauser et al. . |
| 5,444,217 | 8/1995 | Moore et al. . |
| 5,444,815 | 8/1995 | Lee et al. . |
| 5,445,675 | 8/1995 | Kubodera et al. . |
| 5,446,824 | 8/1995 | Moslehi . |
| 5,446,825 | 8/1995 | Moslehi et al. . |
| 5,449,883 | 9/1995 | Tsuruta . |
| 5,451,260 | 9/1995 | Versteeg et al. . |
| 5,452,396 | 9/1995 | Sopori . |
| 5,478,609 | 12/1995 | Okamura . |
| 5,480,489 | 1/1996 | Hasegawa . |
| 5,481,088 | 1/1996 | Peck et al. . |
| 5,482,557 | 1/1996 | Kanai et al. . |
| 5,487,127 | 1/1996 | Gronet et al. . |
| 5,493,987 | 2/1996 | McDiarmid et al. . |
| 5,501,739 | 3/1996 | Yamada et al. . |
| 5,504,831 | 4/1996 | Sandhu et al. . |
| 5,505,779 | 4/1996 | Mizuno et al. . |
| 5,518,549 | 5/1996 | Hellwig . |
| 5,525,160 | 6/1996 | Tanaka et al. . |

| | | | | | | |
|---|---|---|---|---|---|---|
| 5,534,072 | 7/1996 | Mizuno et al. . | | 5,599,397 | 2/1997 | Anderson et al. . |
| 5,539,855 | 7/1996 | Takahashi et al. . | | 5,609,689 | 3/1997 | Kato et al. . |
| 5,551,982 | 9/1996 | Anderson et al. . | | 5,611,898 | 3/1997 | Guhman et al. . |
| 5,551,985 | 9/1996 | Brors et al. . | | 5,624,499 | 4/1997 | Mizuno et al. . |
| 5,561,735 | 10/1996 | Camm . | | 5,624,590 | 4/1997 | Fiory . |
| 5,565,382 | 10/1996 | Tseng et al. . | | 5,635,409 | 6/1997 | Moslehi . |
| 5,571,749 | 11/1996 | Matsuda et al. . | | 5,683,173 | 11/1997 | Gronet et al. . |
| 5,576,059 | 11/1996 | Beinglass et al. . | | 5,689,614 | 11/1997 | Gronet et al. . |
| 5,577,157 | 11/1996 | Sopori . | | 5,715,361 | 2/1998 | Moslehi ................ 392/416 |
| 5,587,019 | 12/1996 | Fujie . | | 5,781,692 | 7/1998 | Wagner ................ 392/411 |
| 5,595,606 | 1/1997 | Fujikawa et al. . | | 5,790,751 | 8/1998 | Gronet et al. ........... 392/416 |

5,970,214

1

HEATING DEVICE FOR SEMICONDUCTOR WAFERS

FIELD OF THE INVENTION

The present invention is generally directed to thermal processing chambers for heating semiconductor wafers using light energy. More particularly, the present invention is directed to improved heating lamp configurations for use in thermal processing chambers.

BACKGROUND OF THE INVENTION

A thermal processing chamber as used herein refers to a device that rapidly heats objects, such as semiconductor wafers. Such devices typically include a substrate holder for holding a semiconductor wafer and a light source that emits light energy for heating the wafer. During heat treatment, the semiconductor wafers are heated under controlled conditions according to a preset temperature regime. For monitoring the temperature of the semiconductor wafer during heat treatment, thermal processing chambers also typically include temperature sensing devices, such as pyrometers, that sense the radiation being emitted by the semiconductor wafer at a selected band of wavelengths. By sensing the thermal radiation being emitted by the wafer, the temperature of the wafer can be calculated with reasonable accuracy.

In alternative embodiments, instead of or in addition to using radiation sensing devices, thermal processing chambers can also contain thermocouples for monitoring the temperature of the wafers. Thermocouples measure the temperature of objects by direct contact.

Many semiconductor heating processes require a wafer to be heated to high temperatures so that various chemical and physical reactions can take place as the wafer is fabricated into a device. During rapid thermal processing, which is one type of processing, semiconductor wafers are typically heated by an array of lights to temperatures, for instance, from about 400° C. to about 1,200° C., for times which are typically less than a few minutes. During these processes, one main goal is to heat the wafers as uniformly as possible.

Problems have been experienced in the past, however, in being able to maintain a constant temperature throughout the wafer and in being able to control the rate at which the wafer is heated. If the wafer is heated nonuniformly, various unwanted stresses can develop in the wafer. Not being able to heat the wafers uniformly also limits the ability to uniformly deposit films on the wafers, to uniformly etch the wafers, beside limiting the ability to perform various other chemical and physical processes on the wafers.

Temperature gradients can be created within the wafer due to various factors. For instance, due to the increased surface area to volume ratio, the edges of semiconductor wafers tend to have a cooling rate and a heating rate that are different than the center of the wafer. The energy absorption characteristics of wafers can also vary from location to location. Additionally, when gases are circulated in the chamber, the gases can create cooler areas on the wafer due to convection.

In the past, various lamp configurations have been proposed in order to overcome the above described deficiencies and improve the ability to heat wafers more uniformly and to control the temperature of the wafers at various locations. These systems, however, have become increasingly complex and expensive to produce. For instance, some systems can contain well over 100 lamps.

As such, a need currently exists for an improved thermal processing chamber that is capable of uniformly heating semiconductor wafers in a relatively simple manner without being as complex as many prior art systems. A need also exists for an improved rapid thermal processing chamber for heating semiconductor wafers that is equipped with controls for varying the amount of energy that is applied to the wafer at different locations based upon the characteristics and properties of the wafer. Such controls are especially necessary due to the increasing demands that are being placed upon the preciseness at which the semiconductor wafers are heat treated and at which semiconductor devices are fabricated.

SUMMARY OF THE INVENTION

The present invention recognizes and addresses the foregoing disadvantages and others of prior art constructions and methods.

Accordingly, it is an object of the present invention to provide an improved thermal processing chamber for heat treating semiconductor wafers.

Another object of the present invention is to provide a thermal processing chamber having an improved lamp configuration for heating the wafers uniformly.

Still another object of the present invention is to provide a heating device for use in thermal processing chambers that contains a plurality of lamps which form overlapping heating zones on a wafer being heated.

Another object of the present invention is to provide a heating device for use in thermal processing chambers that contains a plurality of lamps in a spiral arrangement.

Another object of the present invention to provide a heating device for use in thermal processing chambers that contains a plurality of lamps all positioned at different radial locations with respect to one another.

Still another object of the present invention is to provide a heating device for use in thermal processing chambers that contains tuning lamps spaced between concentric rings of lamps for uniformly heating wafers with a high level of controllability.

These and other objects of the present invention are achieved by providing an apparatus for heat treating semiconductor wafers. The apparatus includes a thermal processing chamber adapted to contain a semiconductor wafer. For instance, a substrate holder can be contained within the chamber upon which the wafer is held. A heating device is placed in communication with the thermal processing chamber which emits thermal light energy onto the wafer held on the substrate holder. The heating device can include an assembly of light energy sources which are positioned to preferentially heat different zones of the wafer.

During the heating process, either the semiconductor wafer is rotated or the light energy sources are rotated. In this manner, the light energy sources form radial heating zones on the wafer. In accordance with the present invention, the light energy sources are positioned so that most of the light energy sources are located at different radial locations with respect to one another. As such, many different radial heating zones are formed on the wafer which aid in heating the wafer uniformly and provide good temporal control during the heating cycle.

For example, in one embodiment, the assembly of light energy sources are positioned such that the centers of no more than three light energy sources are disposed about a common radii extending from a center of the assembly. In an alternative embodiment, no more than two light energy sources are disposed about a common radii, while in another embodiment, each light energy source is disposed about a different radii with respect to the other light energy sources. In these arrangements, many different distinct radial heating zones are created on the wafer by the virtue of wafer rotation. By independently controlling each of the radial heating zones, the wafer can be heated substantially uniformly.

For instance, in one preferred embodiment of the present invention, the light energy sources are assembled so as to form one or more spiral configurations. In a spiral configuration, the light energy sources extend gradually radially outwards, forming multiple radial heating zones on the wafer as described above.

In an alternative embodiment, the light energy sources appear to be randomly positioned with respect to one another such that no discernable pattern is formed. The light energy sources are positioned, however, such that many different radial heating zones are formed on the wafer.

In order to control the amount of light energy that is emitted within each radial heating zone, the apparatus of the present invention can include at least one temperature sensing device which senses the temperature of the wafer at a plurality of locations. For instance, the temperature sensing device can be a plurality of pyrometers, one pyrometer with multiple viewing ports, or one or more thermocouples. The temperature sensing devices can be in communication with a controller, such as a microprocessor, which determines the temperature of the wafer. The controller, in turn, can be in communication with the power supply of the light energy sources for controlling the amount of heat being emitted by the light energy sources in response to the temperature of the wafer. The controller can be configured, for instance, to control the amount of light energy being emitted by each light energy source or can control different groups of the light energy sources.

The light energy sources used in the heating device of the present invention can be, for instance, lamps, such as tungsten-halogen lamps. The lamps can be substantially vertically oriented with respect to the semiconductor wafer, or can be oriented horizontally. In order to maintain the lamps in position, the lamps can be connected to a mounting base. The mounting base can include reflective devices for directing the light energy being emitted by the lamps onto the wafer. The reflective devices can be polished annular surfaces surrounding the lamps or, alternatively, can be in the shape of plates that extend adjacent to the lamps. For example, in one embodiment, the heating device includes reflective plates which extend beyond the length of the lamps in a direction perpendicular to the semiconductor wafer. For instance, in one embodiment, the reflective plates can form spirally shaped channels in which the light energy sources as disposed.

In a further alternative embodiment, the present invention is directed to an apparatus for heat treating semiconductor wafers that includes a thermal processing chamber containing a substrate holder upon which semiconductor wafers are heated. In particular, the wafers are heated by light energy emitted by a heating device placed in communication with the chamber. In this embodiment, the heating device includes concentric rings of light energy sources that heat different radial locations on the semiconductor wafer. At least certain of the concentric rings of light energy sources are further separated by tuning sources which emit a lesser amount of light energy than the concentric rings. The tuning sources supply predetermined amounts of light energy in between the concentric rings for more uniformly heating and controlling the temperature of the semiconductor wafer.

For instance, in one embodiment, the heating device can include three or more concentric rings of light energy sources, such as lamps. One or more tuning sources, which can also be lamps, can then be placed between the concentric rings. A controller can be used to control the amount of light energy being emitted by each of the concentric rings in response to the temperature of the wafer. Further, the controller can also be used to control the amount of light energy being emitted by each of the tuning sources. The tuning sources provide small but effective amounts of light energy between the concentric rings which serve to enhance the temperature uniformity of the wafer being heated.

In one embodiment, reflective plates can also be positioned in between the concentric rings of light energy sources. The reflective plates can be arc-shaped and can extend adjacent to the light energy sources. The arc-shaped reflective plates can be positioned in between the tuning sources along a common radius. The reflective plates serve to direct the light energy being emitted by the concentric rings onto specific radial heating zones on the wafer. The light energy sources can be substantially vertically oriented with respect to the wafer or can be horizontally oriented.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Repeat use of references characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to an apparatus and method for heating semiconductor wafers uniformly and at a controlled rate. The apparatus includes a thermal processing chamber in communication with a heating device that is used to heat treat semiconductor wafers contained in the chamber. The heating device contains a plurality of lamps that are positioned at preselected locations for heating the wafers.

During heating, the wafer is rotated with respect to the plurality of lamps. In this manner, the lamps form radial heating zones on the wafer. In accordance with the present invention, the lamps are configured so that many different radial heating zones are formed. The energy supplied to each heating zone is then controlled for heating the wafer uniformly.

In one embodiment, the temperature at different locations of the wafer is monitored. Based upon the temperature sensed at the different locations, the energy being emitted by the lamps is selectively controlled for maintaining a constant temperature throughout the wafer.

Figure 1:
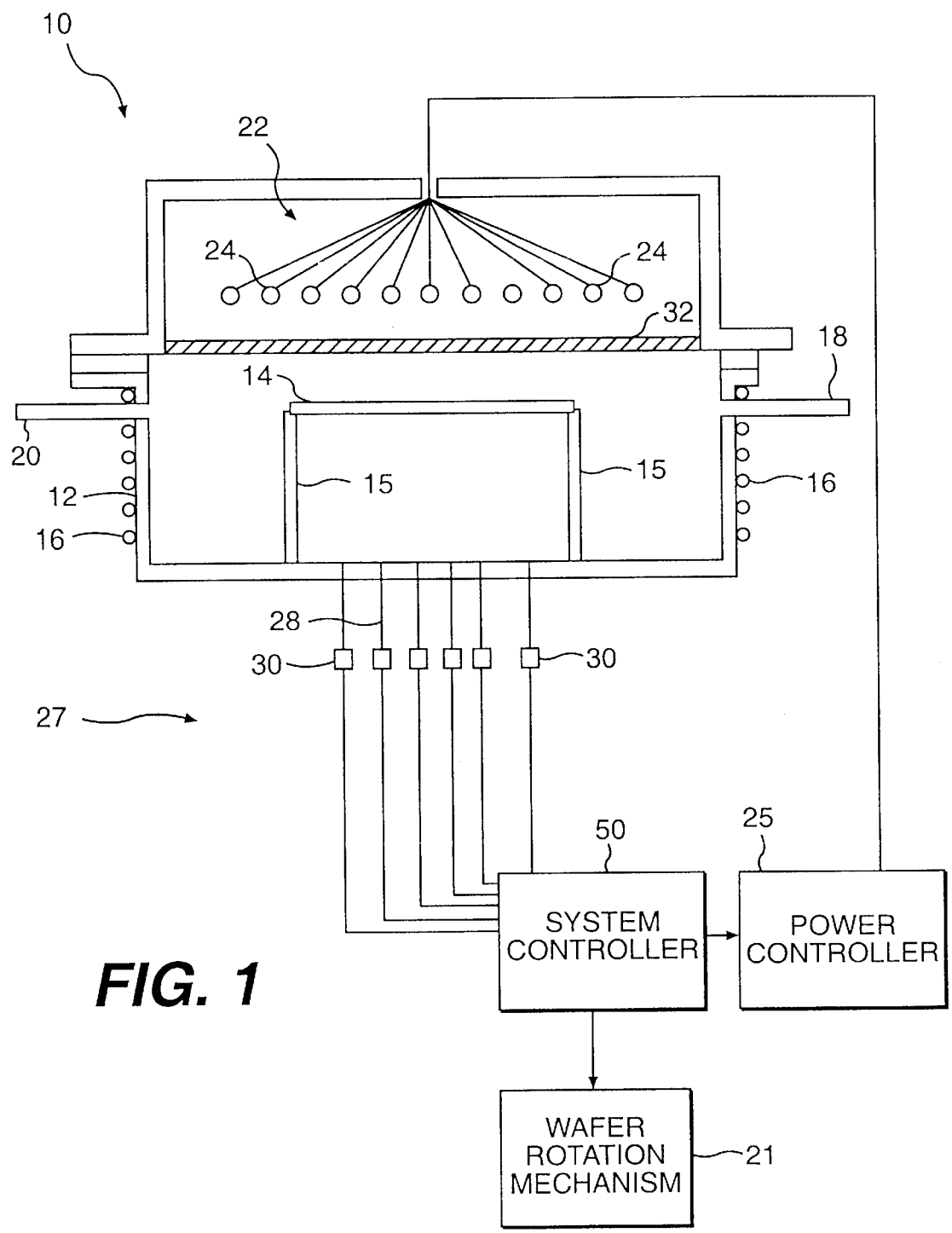
FIG. 1 is a cross-sectional view of one embodiment of a thermal processing chamber made in accordance with the present invention.

Referring to FIG. 1, a system generally 10 made in accordance with the present invention for heat treating a wafer made from a semiconductive material, such as silicon, is illustrated. System 10 includes a processing chamber 12 adapted to receive substrates such as a wafer 14 for conducting various processes. As shown, wafer 14 is positioned on a substrate holder 15 made from a thermal insulating material such as quartz. Chamber 12 is designed to heat wafer 14 at very rapid rates and under carefully controlled conditions. Chamber 12 can be made from various materials, including metals and ceramics. For instance, chamber 12 can be made from stainless steel or quartz.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, substrate holder 15, in one embodiment, can be adapted to rotate wafer 14 using a wafer rotation mechanism 21. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons, and other substrates having any particular shape.

A heat source or heating device generally 22 is included in communication with chamber 12 for heating wafer 14 during processing. Heating device 22 includes a plurality of lamps 24, such as tungsten-halogen lamps. As shown in FIG. 1, lamps 24 are placed above wafer 14. It should be understood, however, that lamps 24 may be placed at any particular location. Further, additional lamps could be included within system 10 if desired.

The use of lamps 24 as a heat source is generally preferred. For instance, lamps have much higher heating and cooling rates than other heating devices, such as electrical elements or conventional furnaces. Lamps 24 create a rapid isothermal processing system that provide instantaneous energy, typically requiring a very short and well controlled start up period. The flow of energy from lamps 24 can also be abruptly stopped at any time. As shown in the figure, lamps 24 are equipped with a gradual power controller 25 that can be used to increase or decrease the electromagnetic energy being emitted by any of the lamps.

In order to monitor the temperature of wafer 14 during the heating process, in this embodiment, thermal processing chamber 12 includes plurality of radiation sensing devices generally 27. Radiation sensing devices 27 include a plurality of optical fibers or light pipes 28 which are, in turn, in communication with a plurality of corresponding light detectors 30. Optical fibers 28 are configured to receive thermal energy being emitted by wafer 14 at a particular wavelength. The amount of sensed radiation is then communicated to light detectors 30 which generate a usable voltage signal for determining the temperature of the wafer which can be calculated based, in part, on Planck's Law. In one embodiment, each optical fiber 28 in combination with a light detector 30 comprises a pyrometer. In another embodiment, the optical fibers, 28, are routed to a single but multiplexing radiation sensing device.

In general, thermal processing chamber 12 can contain one or a plurality of radiation sensing devices. In a preferred embodiment, as shown in FIG. 1, thermal processing chamber 12 contains a plurality of radiation sensing devices that measure the temperature of the wafer at different locations. Knowing the temperature of the wafer at different locations can then be used to control the amount of heat being applied to the wafer as will be described in more detail hereinafter. The amount of heat applied to various zones of the wafer can also be controlled in an open loop fashion. In this configuration the ratios between the various heating zones can be pre-determined after manual optimization. In subsequent processes, these ratios are used with no changes during the heating cycles.

During the process of the present invention, system 10 should be designed such that optical fibers 28 only detect thermal radiation being emitted by wafer 14 and not detect radiation being emitted by lamps 24. In this regard, system 10 includes a filter 32 which prevents thermal radiation being emitted by lamps 24 at the wavelength at which light detectors 30 operate from entering chamber 12. Filter 32 also serves to isolate lamps 24 from wafer 14 and prevent contamination of the chamber. Filter 32 as shown in FIG. 1 can be a window positioned between chamber 12 and heat source 22. In an alternative embodiment, each lamp 24 can be covered by a separate filter.

In one embodiment, filter 32 is made from fused silica or quartz. Fused silica is known to absorb thermal radiation very effectively at selected wavelengths. For instance, synthetic fused silica with high concentration of OH ions is very effective at absorbing light at a wavelength of from approximately 2.7 micrometers to about 2.8 micrometers. Thus, in one embodiment, when filter 32 is made from synthetic fused silica, light detectors 30 can be configured to detect thermal radiation being emitted by wafer 14 at a wavelength of about 2.7 micrometers. In other embodiments, the separation between radiation arriving to the sensor from the wafer and lamps is achieved by mechanical means of isolation. In these embodiments, buffers and shields are present to prevent a direct path from forming between a light source and a sensing port.

Besides using radiation sensing devices, other temperature sensing devices may be used in the system of the present invention. For instance, one or more thermocouples may be incorporated into the system for monitoring the temperature of the wafer at a single location or at a plurality of locations. The thermocouples can be placed in direct contact with the wafer or can be placed adjacent the wafer from which the temperature can be extrapolated.

System 10 further includes a system controller 50 which can be, for instance, a microprocessor. Controller 50 receives voltage signals from light detectors 30 that represent the radiation amounts being sampled at the various locations. Based on the signals received, controller 50 is configured to calculate the temperature of wafer 14 at different locations.

System controller 50 as shown in FIG. 1 can also be in communication with lamp power controller 25. In this arrangement, controller 50 can determine the temperature of wafer 14, and, based on this information, control the amount of thermal energy being emitted by lamps 24. In this manner, instantaneous adjustments can be made regarding the conditions within reactor 12 for processing wafer 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafer 14 is rotated within the chamber.

Figure 2:
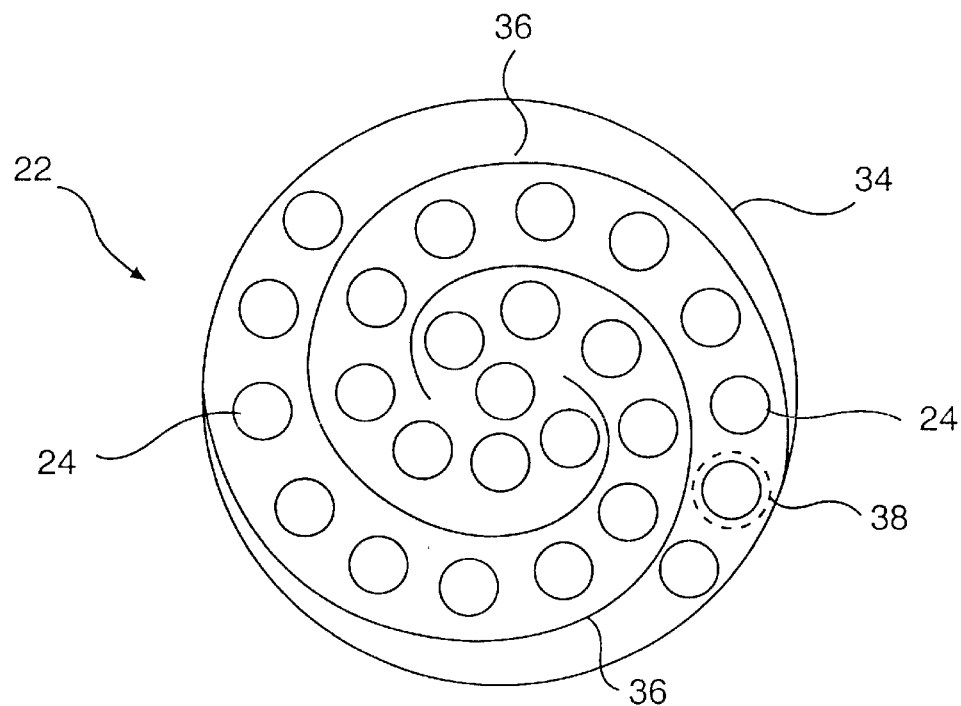
FIG. 2 is a plan view of one embodiment of a heating device that may be used in thermal processing chambers made in accordance with the present invention.

As described above, the present invention is generally directed to a particular heating configuration that is used within thermal processing chamber 12. Referring to FIG. 2, one embodiment of a heating device 22 that can be used in combination with thermal processing chamber 12 in accordance with the present invention is illustrated. As shown, heating device 22 includes a plurality of light energy sources, such as lamps 24 that are secured to a mounting base 34. In particular, in this embodiment, lamps 24 are arranged in a spiral configuration. Specifically, lamps 24 form two spirals on mounting base 34. It should be understood, however, that the present invention also encompasses a lamp arrangement where only one spiral is formed or a lamp arrangement where more than two spirals are formed.

In accordance with the present invention, it has been discovered that spirally arranged lamps provide various benefits for heating semiconductor wafers uniformly. In particular, when arranged in a spiral, the lamps gradually extend from the center of the lamp assembly to the outside circumference of the assembly. In this manner, the lamps are present at many different radial locations on mounting base 34 and therefore form many different heating zones that are radially located about the center of the wafer as the wafer rotates relative to the lamp assembly.

In order to heat a wafer uniformly with heating device 22 as shown in FIG. 2, controller 50 as shown in FIG. 1 can be configured to control the amount of light energy being emitted by each of the lamps 24 depending upon the radial location. More particularly, the light energy being emitted by lamps 24 can be controlled in response to the temperature of the wafer at different locations as may be monitored by light detectors 30.

In order to assist in directing the light energy being emitted by lamps 24 onto a wafer, preferably the lamps are associated with a reflector or a set of reflectors. For instance, mounting base 34 can include a reflective surface that surrounds the lamps. In one embodiment, reflective annular recesses can be formed into mounting base 34 for directing the light energy onto the wafer.

Alternatively or additionally, reflective plates 36 can also be attached to mounting base 34 and used in association with lamps 24. For example, as shown in FIG. 2, spirally shaped reflective plates 36 can be included which also form spirals on mounting base 34. Reflective plates 36 can be positioned perpendicular to a wafer being heated and can extend a length shorter than lamps 24, can extend approximately the same length as lamps 24, or can extend beyond the length of lamps 24. In the embodiment illustrated in FIG. 2, reflective plates 36 form spirally shaped channels on mounting base 34 in which lamps 24 are disposed. When present, reflective plates 36 serve to direct the light energy being emitted by lamps 24 onto desired locations on the wafer.

In a still further alternative embodiment, as shown in phantom, each lamp 24 can also be associated with a circular reflective plate 38. Similar to reflective plates 36, circular reflective plate 38 can extend any desired distance along the length of lamps 24. Circular reflective plates 38 can be used alone or in conjunction with spirally shaped reflective plates 36, depending upon the particular application and the desired result. Specifically, different types of reflective arrangements can be used in order to direct and focus the energy being emitted by lamps 24 to any desired extent.

Figure 3:
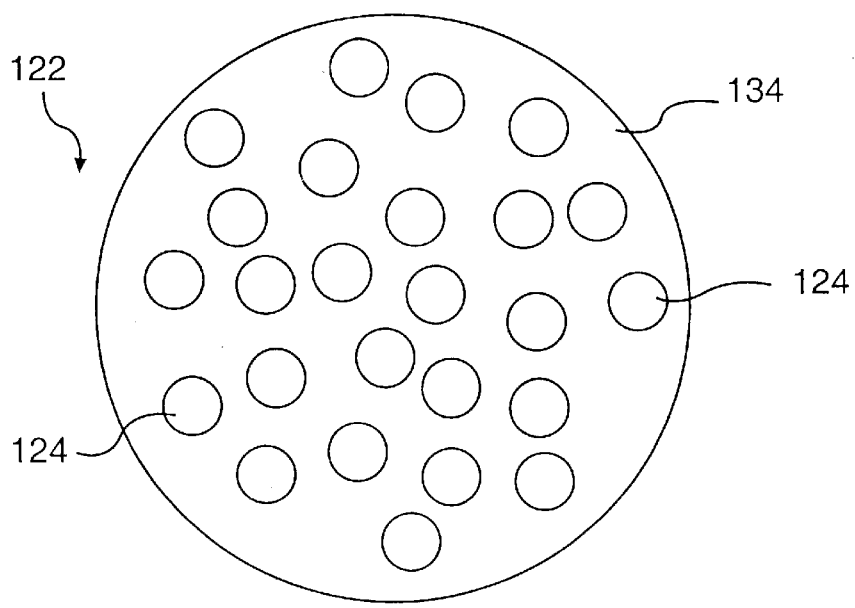
FIG. 3 is a plan view of a second alternative embodiment of a heating device that may be used in thermal processing chambers made in accordance with the present invention.

Referring to FIG. 3, an alternative embodiment of a heating device generally 122 for use in thermal processing chamber 12 in accordance with the present invention is illustrated. As shown, in this embodiment, lamps 124 are randomly dispersed on mounting base 134 according to no discernable pattern. Specifically, lamps 124 do not form any rows, columns, circles, or other geometrical shapes. Although appearing to be randomly arranged upon mounting base 134, however, the lamps are selectively placed at many different radial positions spaced from the collective center of the assembly. Similar to the spiral configuration illustrated in FIG. 2, in this manner lamps 124 form many different radial heating zones on a wafer that is rotated in relation to heating device 122. Thus, the wafer is subjected to direct heating substantially along every point of its radius which allows for better control over temperature uniformity and over the rate at which the wafer is heated.

For instance, system controller 50 as shown in FIG. 1 can be configured to receive temperature information from the temperature sensing devices contained within the system. Preferably the temperature sensing devices determine the temperature of the wafer at a plurality of locations. Based upon this temperature information, controller 50 can then be configured to control the amount of light being emitted by lamps 124. Controller 50 can control each and every lamp individually or can control the amount of light energy being emitted by a group of the lamps that are spaced relatively close together.

Heating device 122 as shown in FIG. 3 can also include various reflective devices similar to the reflective devices described in FIG. 2. The reflective devices can be used to direct light energy being emitted by lamps 124 onto particular radial locations on a wafer being heated.

Figure 4:
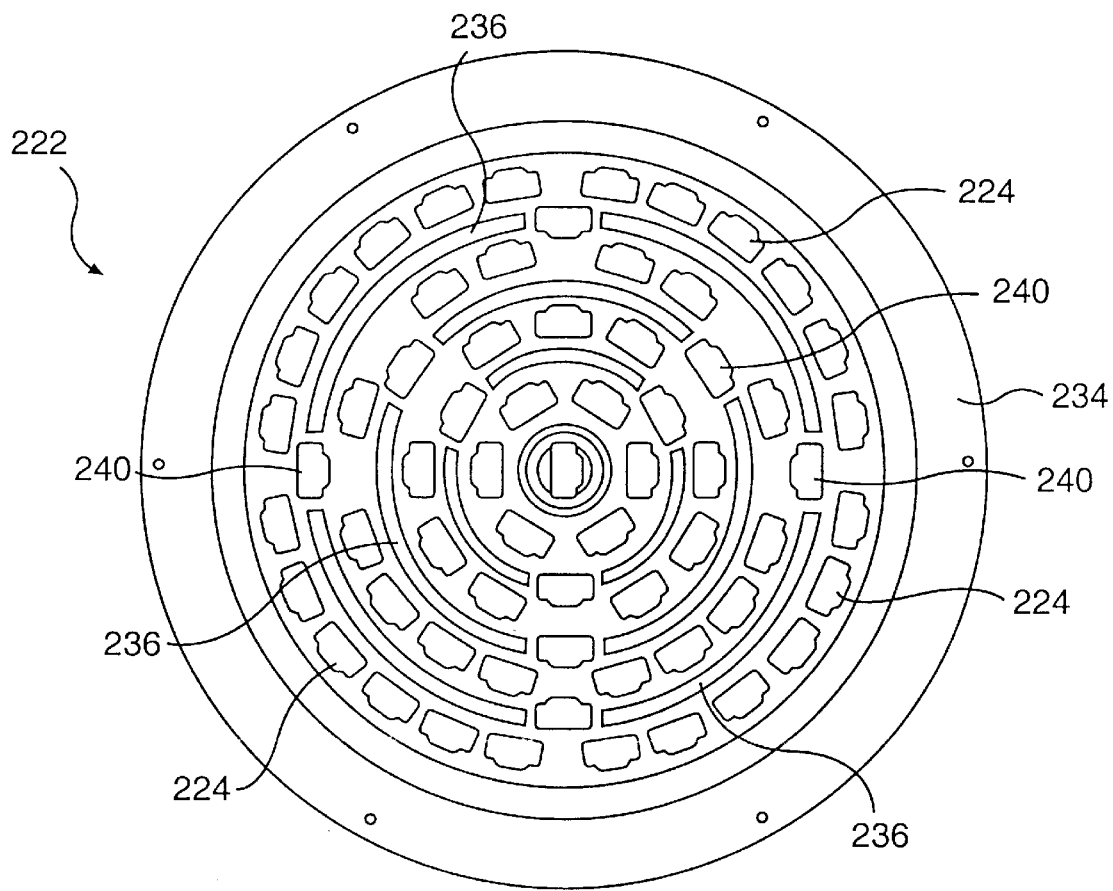
FIG. 4 is a plan view of a third alternative embodiment of a heating device that may be used in thermal processing chambers made in accordance with the present invention.

Referring to FIG. 4, a third alternative embodiment of a heating device generally 222 for use in thermal processing chamber 12 in accordance with the present invention is illustrated. As shown, heating device 222 includes an assembly of lamps 224 secured to a mounting base 234. In particular, lamps 224 are arranged in five concentric rings which each serve to heat a separate radial zone on a wafer.

In accordance with the present invention, in order to heat a wafer more uniformly, heating device 222 further includes tuning lamps 240 which are positioned in between the concentric rings of lamps 224. Tuning lamps 240 are designed to emit relatively smaller amounts of light energy in between each of the concentric rings of lamps. Tuning lamps 240 in essence provide light energy to the wafer at locations in between the primary radial heating zones created by the concentric rings. When controlled according to the temperature of the wafer, the light being emitted by tuning lamps 240 has been found to greatly enhance the temperature uniformity of the wafer.

In one preferred embodiment, as shown in FIG. 4, heating device 222 also includes arc-shaped reflector plates which are located in between the concentric rings of lamps 224 along the same radius as tuning sources 240. Reflective plates 236 are substantially vertically oriented with respect to a wafer placed in communication with heating device 222 and extend at least a portion of the length of lamps 224. More particular, arc-shaped reflector plates 236 can extend less than the length of lamps 224, about the same length as lamps 224 or beyond the length of lamps 224.

Reflector plates 236 serve to direct the light energy being emitted by the concentric rings of lamps. Specifically, the reflector plates better define the radial heating zones located on a wafer being heated by the device. Besides arc-shaped reflector plates 236, however, it should be understood that various other reflective devices may be used in heating device 222.

During operation, heating device 222 is preferably in communication with a system controller 50 as shown in FIG. 1. Based upon the temperature of a wafer being heated, system controller 50 can be designed to vary the amount of light energy being emitted by lamps 224 and tuning lamps 240. In this embodiment, each of the lamps that make up a concentric ring can be controlled together in order to form radial heating zones on the wafer. Tuning lamps 240 can then be controlled by system controller 50 independent of the concentric rings in a manner that enhances temperature uniformity throughout the wafer.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An apparatus for heat treating semiconductor wafers comprising:
a thermal processing chamber adapted to contain a semiconductor wafer; and
a heating device in communication with said thermal processing chamber for heating a semiconductor wafer contained in said chamber, said heating device comprising concentric rings of light energy sources for heating different radial locations on said semiconductor wafer, at least certain of said concentric rings of said light energy sources being separated by at least one tuning source, said at least one tuning source being configured to only emit a lesser amount of light energy than any adjacent concentric ring of light energy sources, said at least one tuning source supplying predetermined amounts of light energy in between said concentric rings for more uniformly heating said semiconductor wafer.

2. An apparatus as defined in claim 1, wherein said light energy sources are substantially vertically oriented with respect to said semiconductor wafer.

3. An apparatus as defined in claim 1, further comprising:
at least one temperature sensing device for sensing the temperature of said semiconductor wafer at least at one location; and
a controller in communication with said at least one temperature sensing device, at least certain of said light energy sources, and said tuning sources, said controller being configured to control the amount of light energy being emitted by said light energy sources and said tuning sources in response to temperature information received from said at least one temperature sensing device.

4. An apparatus as defined in claim 3, wherein said controller is configured to control the amount of light energy being emitted by each concentric ring of light energy sources independent of the other concentric rings.

5. An apparatus as defined in claim 4, wherein said controller is configured to control the amount of light energy being emitted by said tuning sources independent of said concentric rings.

6. An apparatus as defined in claim 1, wherein said heating device comprises at least four concentric rings of light energy sources.

7. An apparatus as defined in claim 1, further comprising a substrate holder for holding said semiconductor wafer, said substrate holder being configured to rotate said wafer.

8. An apparatus as defined in claim 1, wherein said heating device is configured to rotate.

9. An apparatus as defined in claim 1, further comprising arc-shaped reflector plates position in between said concentric rings of light energy sources.

10. An apparatus as defined in claim 9, wherein said arc-shaped reflective plates extend in between certain of said tuning sources along a common radii.

11. An apparatus for heat treating semiconductor wafers comprising:
a thermal processing chamber;
a substrate holder contained in said thermal processing chamber for holding a semiconductor wafer, said substrate holder being configured to rotate said wafer;
a heating device in communication with said thermal processing chamber for heating a semiconductor wafer held on said substrate holder, said heating device comprising concentric rings of light energy sources for heating different radial locations on said semiconductor wafer, at least certain of said concentric rings of light energy sources being separated by at least one tuning source said at least one tuning source being configured to only emit a lesser amount of light energy than any adjacent concentric ring of light energy sources, said at least one tuning source supplying predetermined amounts of light energy in between said concentric rings for more uniformly heating said semiconductor wafer;
arc-shaped reflector plates located in between said concentric rings for directing light energy onto said semiconductor wafer;
at least one temperature sensing device for sensing the temperature of said wafer at least at one location; and
a controller in communication with said at least one temperature sensing device, said light energy sources, and said tuning sources, said controller being configured to control the amount of light energy being emitted by said light energy sources and said tuning sources in response to temperature information received from said at least one temperature sensing device.

12. An apparatus as defined in claim 11, wherein said arc-shaped reflective plates extend in between certain of said tuning sources along a common radii.

13. An apparatus as defined in claim 11, wherein said reflector plates have a length that extends beyond said light energy sources.

14. An apparatus as defined in claim 11, wherein said light energy sources are substantially vertically oriented with respect to said semiconductor wafer.

15. An apparatus as defined in claim 11, wherein said at least one temperature sensing device comprises a plurality of pyrometers.

16. An apparatus as defined in claim 11, wherein said at least one temperature sensing device comprises a thermocouple.

17. An apparatus as defined in claim 11, wherein said heating device contains at least four concentric rings.

18. An apparatus for heat treating semiconductor wafers comprising:
a thermal processing chamber adapted to contain a semiconductor wafer; and
a heating device in communication with said thermal processing chamber for heating a semiconductor wafer contained in said chamber, said heating device comprising concentric rings of light energy sources for heating different radial locations on said semiconductor wafer, at least certain of said concentric rings of said light energy sources being separated by at least one tuning source, wherein the number of tuning sources located between adjacent concentric rings is less than the number of light energy sources that comprise either of said adjacent rings, said tuning sources supplying predetermined amounts of light energy in between said concentric rings for more uniformly heating said semiconductor wafer.

19. An apparatus as defined in claim 18, wherein said light energy sources are substantially vertically oriented with respect to said semiconductor wafer.

20. An apparatus as defined in claim 18, further comprising:
at least one temperature sensing device for sensing the temperature of said semiconductor wafer at least at one location; and
a controller in communication with said at least one temperature sensing device, at least certain of said light energy sources, and said tuning sources, said controller being configured to control the amount of light energy being emitted by said light energy sources and said tuning sources in response to temperature information received from said at least one temperature sensing device.

21. An apparatus as defined in claim 20, wherein said controller is configured to control the amount of light energy being emitted by each concentric ring of light energy sources independent of the other concentric rings.

22. An apparatus as defined in claim 20, wherein said controller is configured to control the amount of light energy being emitted by said tuning sources independent of said concentric rings.

23. An apparatus as defined in claim 18, wherein said heating device comprises at least four concentric rings of light energy sources.

24. An apparatus as defined in claim 18, further comprising a substrate holder for holding said semiconductor wafer, said substrate holder being configured to rotate said wafer.

25. An apparatus as defined in claim 18, further comprising arc-shaped reflector plates position in between said concentric rings of light energy sources.

26. An apparatus as defined in claim 25, wherein said arc-shaped reflective plates extend in between certain of said tuning sources along a common radii.

* * * * *